(12) United States Patent
Quan et al.

(10) Patent No.: US 12,525,518 B2
(45) Date of Patent: Jan. 13, 2026

(54) SEMICONDUCTOR DEVICE AND METHOD OF FORMING DOUBLE-SIDED RECTIFYING ANTENNA ON POWER MODULE

(71) Applicant: STATS ChipPAC Pte. Ltd., Singapore (SG)

(72) Inventors: Chunhe Quan, Seoul (KR); JinYoung Lee, Incheon (KR); Hyungwoo Park, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 381 days.

(21) Appl. No.: 18/314,626

(22) Filed: May 9, 2023

(65) Prior Publication Data

US 2024/0379511 A1    Nov. 14, 2024

(51) Int. Cl.
*H01L 23/498* (2006.01)
*H01L 21/48* (2006.01)
*H01Q 1/22* (2006.01)

(52) U.S. Cl.
CPC .... *H01L 23/49811* (2013.01); *H01L 21/4857* (2013.01); *H01L 23/49822* (2013.01); *H01Q 1/2283* (2013.01)

(58) Field of Classification Search
CPC ............. H01L 23/66; H01L 2223/6677; H01L 23/49816; H01L 24/16
See application file for complete search history.

(56) References Cited

U.S. PATENT DOCUMENTS

| | | | |
|---|---|---|---|
| 7,664,354 B2 | 2/2010 | Keller et al. | |
| 10,192,796 B2 * | 1/2019 | Lin | H01L 23/3128 |
| 10,431,892 B2 | 10/2019 | Garcia et al. | |
| 11,018,098 B2 * | 5/2021 | Kaeding | H01Q 25/00 |
| 11,600,932 B2 | 3/2023 | Tang et al. | |
| 2014/0252595 A1 | 9/2014 | Yen et al. | |
| 2021/0358872 A1 | 11/2021 | Pietambaram et al. | |
| 2022/0320020 A1 * | 10/2022 | Hsu | H01L 23/5384 |

OTHER PUBLICATIONS

Malik, Bilal Tariq, et al. "Wireless power transfer system for battery-less sensor nodes." IEEE Access 8 (2020): 95878-95887.
Zeng, Miaowang, et al. "A compact dual-band rectenna for GSM900 and GSM1800 energy harvesting." International Journal of Antennas and Propagation 2018 (2018).

* cited by examiner

*Primary Examiner* — Robert J May
(74) *Attorney, Agent, or Firm* — Robert D. Atkins; PATENT LAW GROUP: Atkins and Associates, P.C.

(57) ABSTRACT

A semiconductor device has a substrate and a first electrical interconnect structure formed over a first surface of the substrate. A second electrical interconnect structure is formed over a second surface of the substrate. An electrical component is disposed over the first surface of the substrate or over the second surface of the substrate. A first antenna is formed over the first electrical interconnect structure. A second antenna is formed over the second electrical interconnect structure. The first electrical interconnect structure has an insulating material formed over the first surface of the substrate, and a conductive via formed through the insulating material. Alternatively, the first electrical interconnect structure has an insulating layer formed over the first surface of the substrate, a conductive layer formed over the insulating layer, and a conductive via formed through the insulating layer and conductive layer.

24 Claims, 18 Drawing Sheets

SEMICONDUCTOR DEVICE AND METHOD OF FORMING DOUBLE-SIDED RECTIFYING ANTENNA ON POWER MODULE

FIELD OF THE INVENTION

The present invention relates in general to semiconductor devices and, more particularly, to a semiconductor device and method of forming double-sided rectifying antenna on a power module for energy harvesting.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into a system-in-package (SiP) power module for higher density in a small space and extended electrical functionality. FIG. 1 illustrates a conventional SiP power module 50 with rectifying antenna 52 transmitting and/or receiving RF signals, e.g., in the microwave band. SiP power module 50 receives electromagnetic energy or radiation, removes the alternating current (AC) components, and converts to direct current (DC) signals for the power components. Accordingly, SiP power module 50 uses low pass filter (LPF) 54 to smooth the AC signal, and Schottky diode 56 and DC filter 58 for impedance matching to load circuit 60. Load circuit 60 contains semiconductor die and IPDs to provide the electrical functionality of the power module. The electrical components and devices within SiP module 50 are typically connected directly in a planar structure. For example, rectifying antenna 52, LPF 54, Schottky diode 56, DC filter 58, and load circuit 60 are shown as formed, mounted, or otherwise disposed horizontally across large substrate 62, as shown in the top view of SiP power module 50 in FIG. 1*b*. Any impedance discontinuity between the antenna and other components leads to low efficiency. Receiving weak signal with the large substrate 62 lead to low portability. A need exists for an improved antenna design for the SiP power module.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
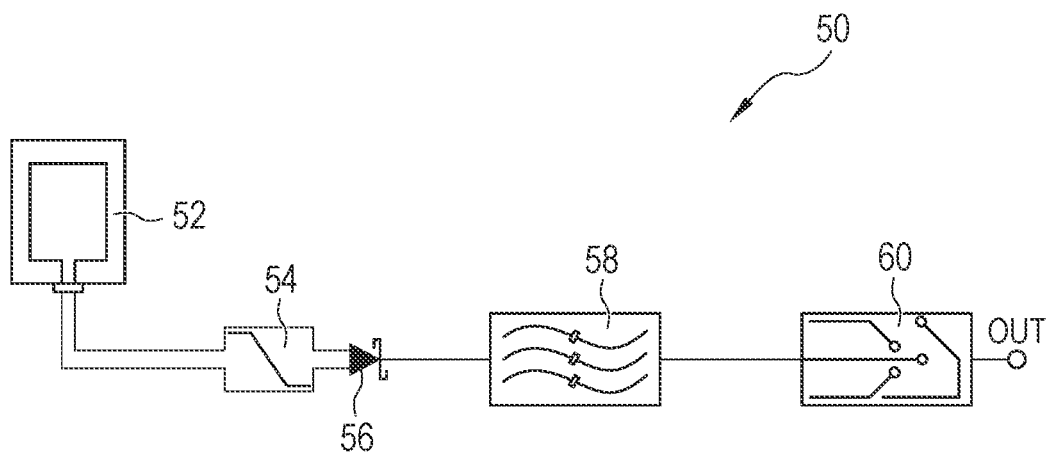
FIGS. 1*a*-1*b* illustrate a conventional SiP power module with rectifying antenna.
Figure 1B:
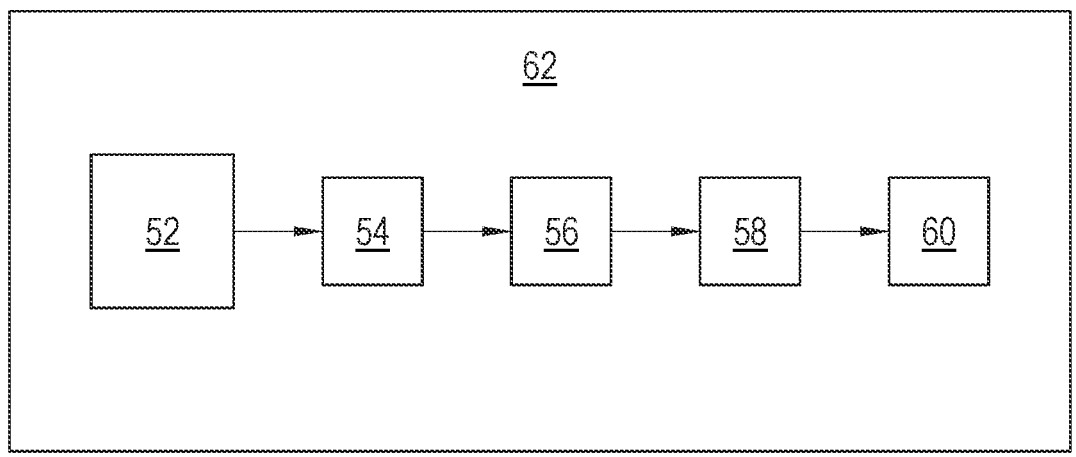
Figure 2A:
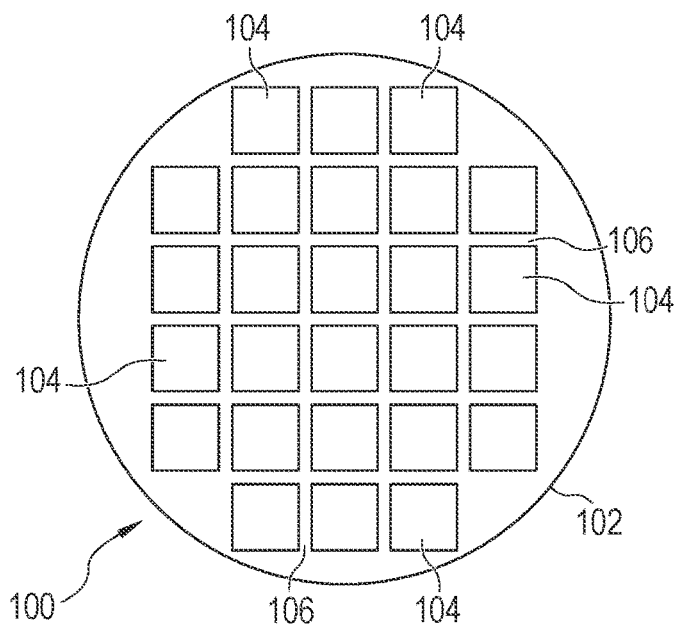
FIGS. 2*a*-2*c* illustrate a semiconductor wafer with a plurality of semiconductor die separated by a saw street.

FIG. 2*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 2B:
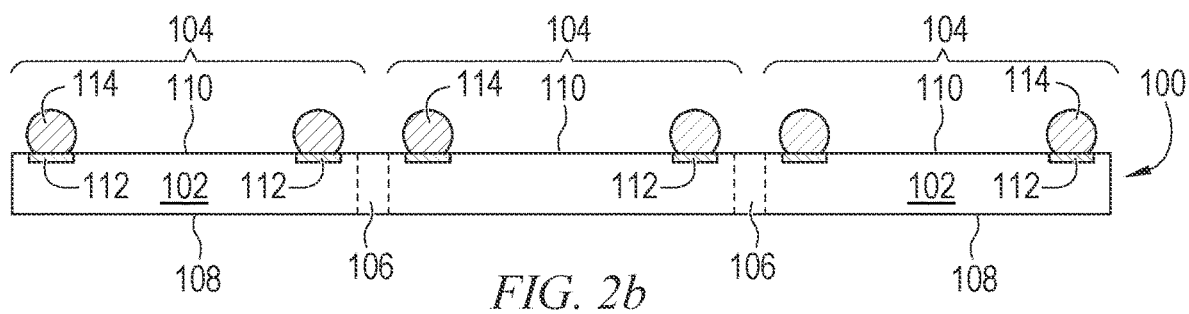

FIG. 2b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), Cu, tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 2C:
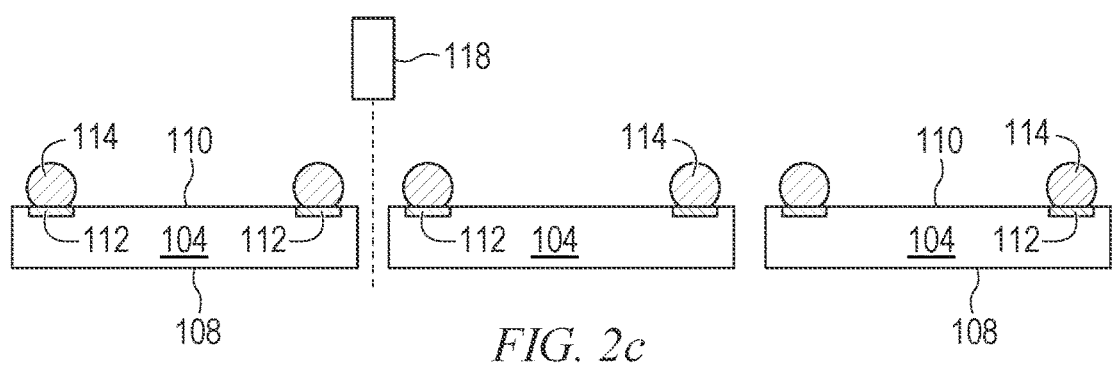

In FIG. 2c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 3A:
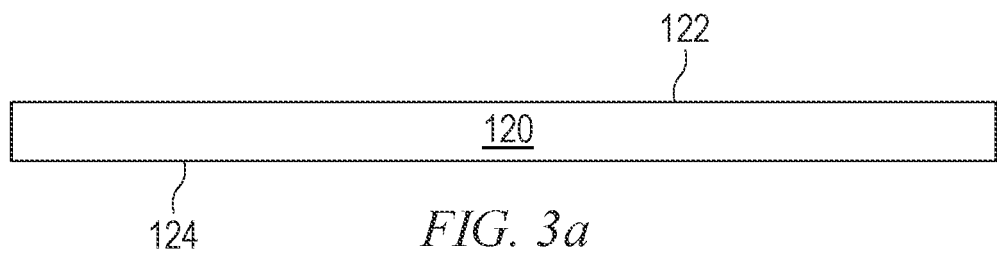
FIGS. 3*a*-3*r* illustrate a process of forming a double-sided rectifying antenna on a power module.
Figure 3B:
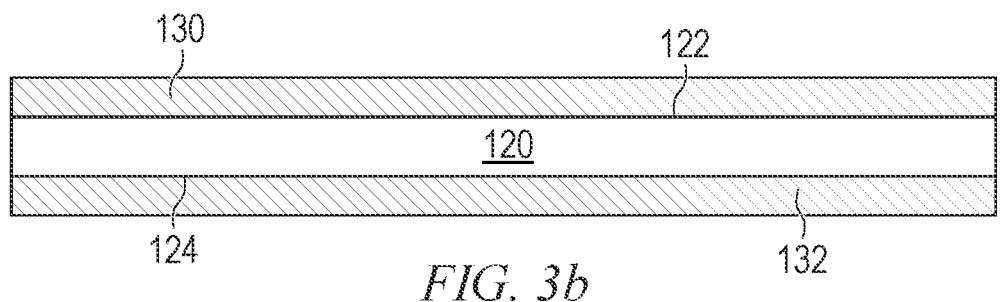
Figure 3C:
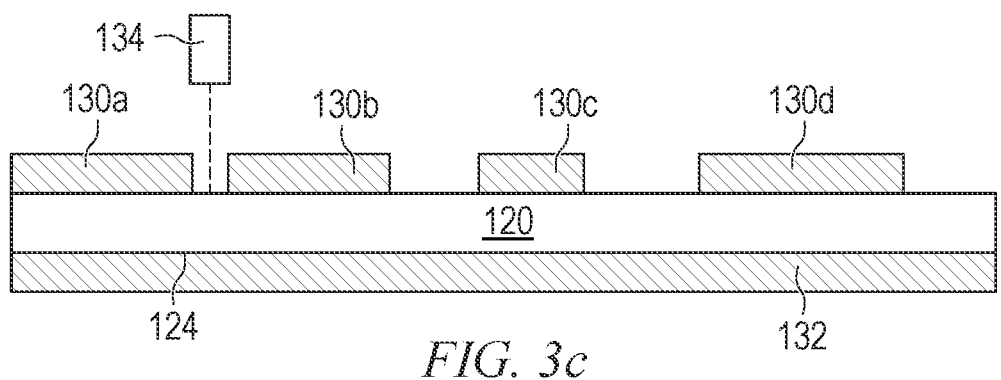
Figure 3D:
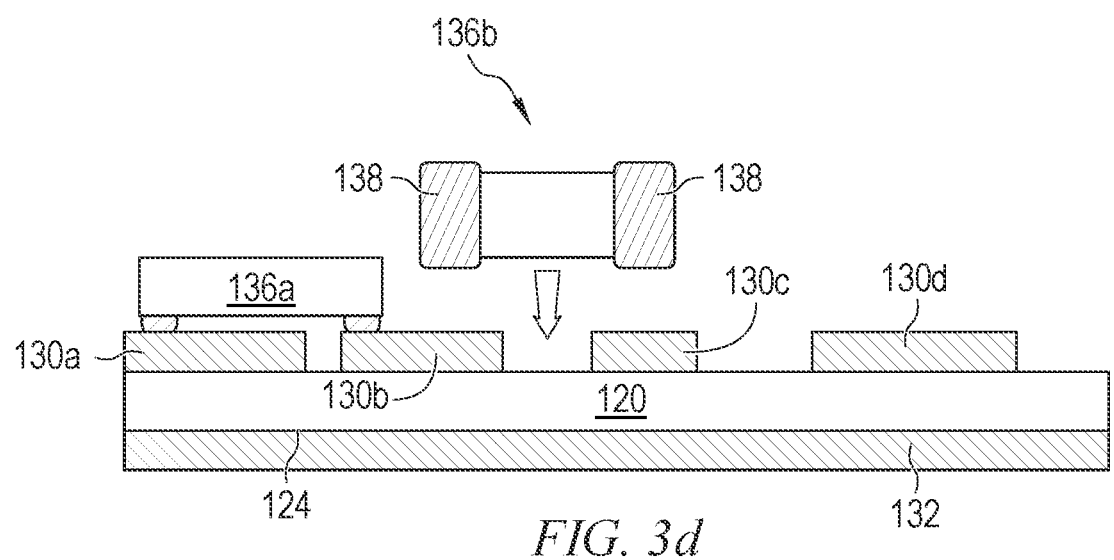
Figure 3E:
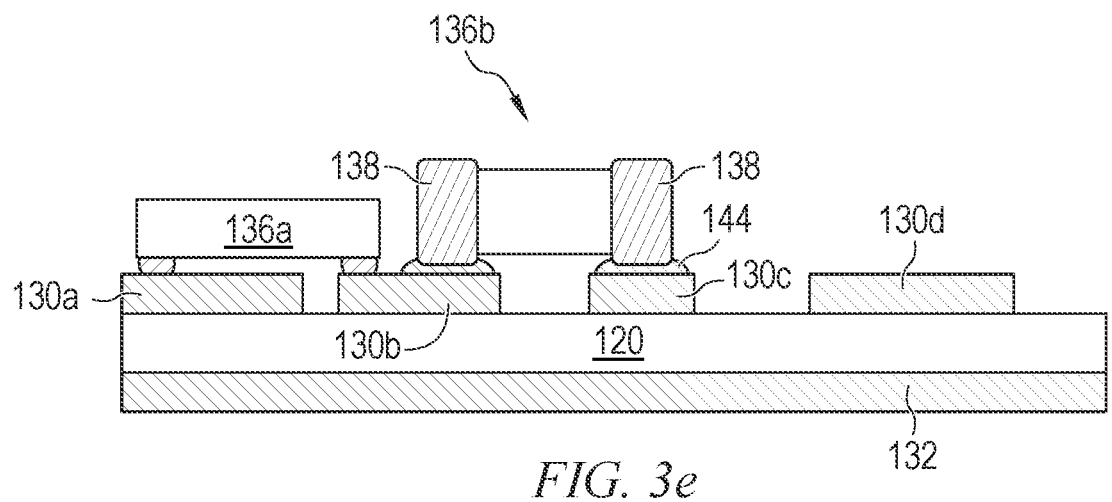
Figure 3F:
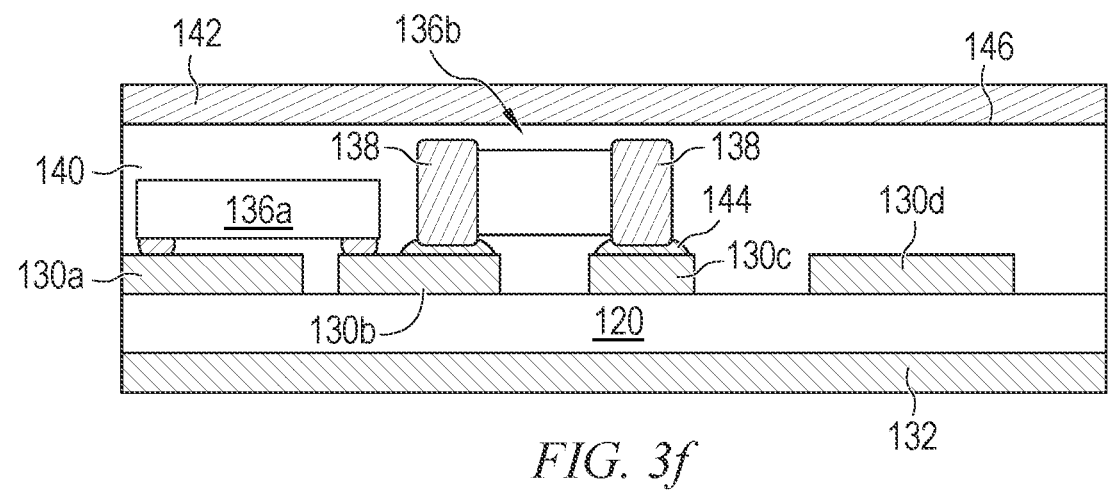
Figure 3G:
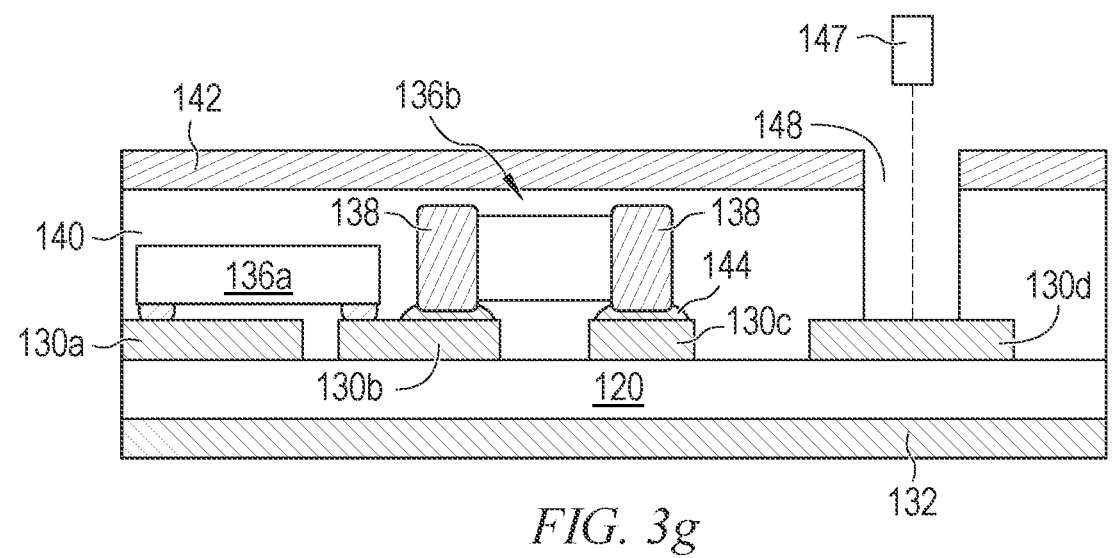
Figure 3H:
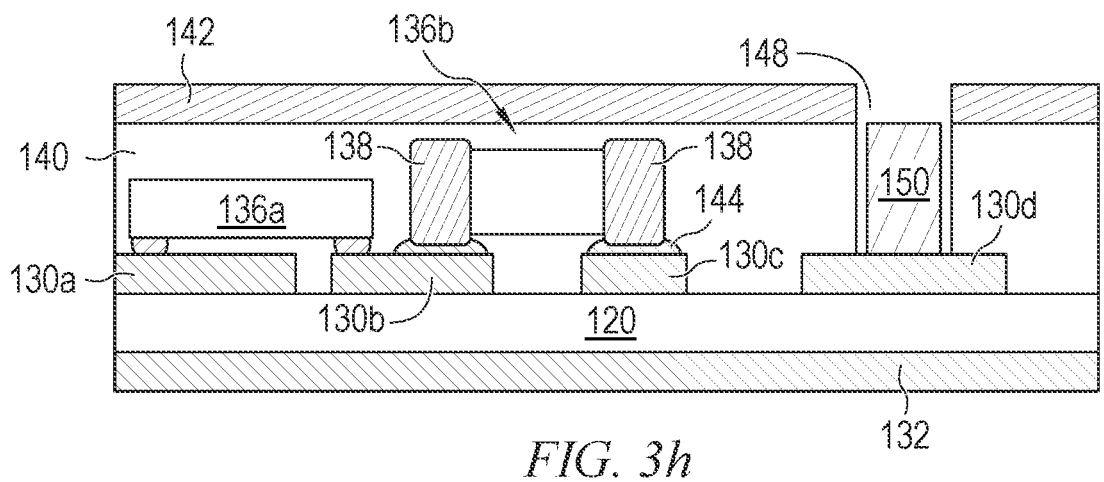
Figure 3I:
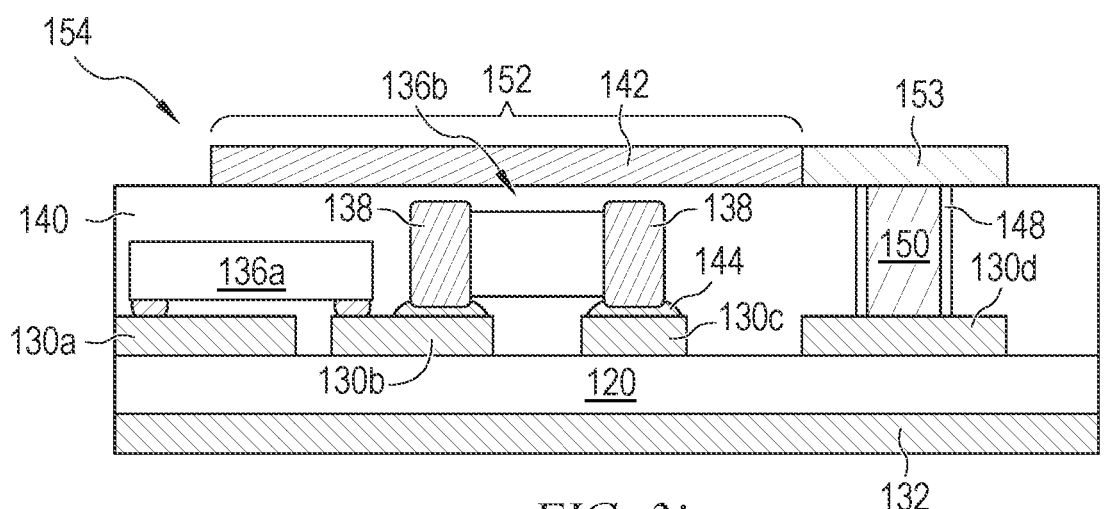
Figure 3L:
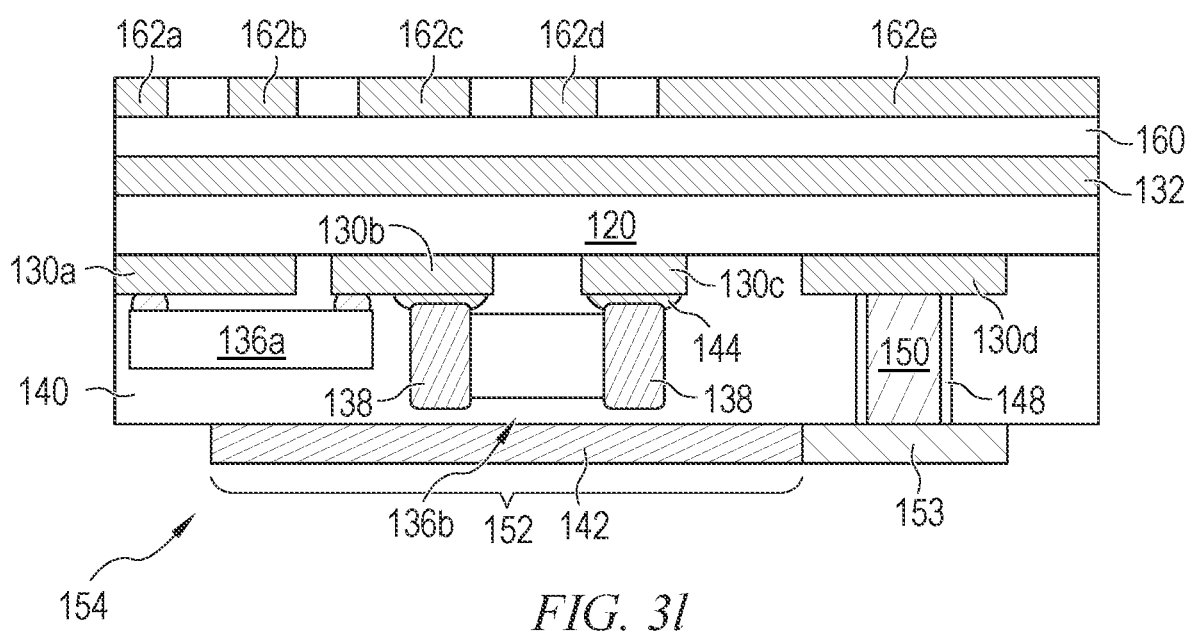
Figure 3J:
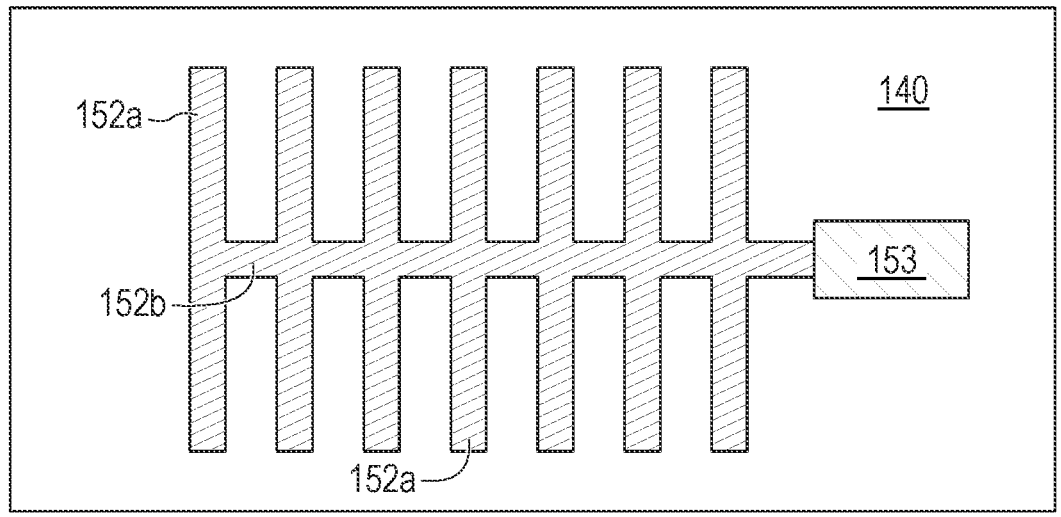
Figure 3K:
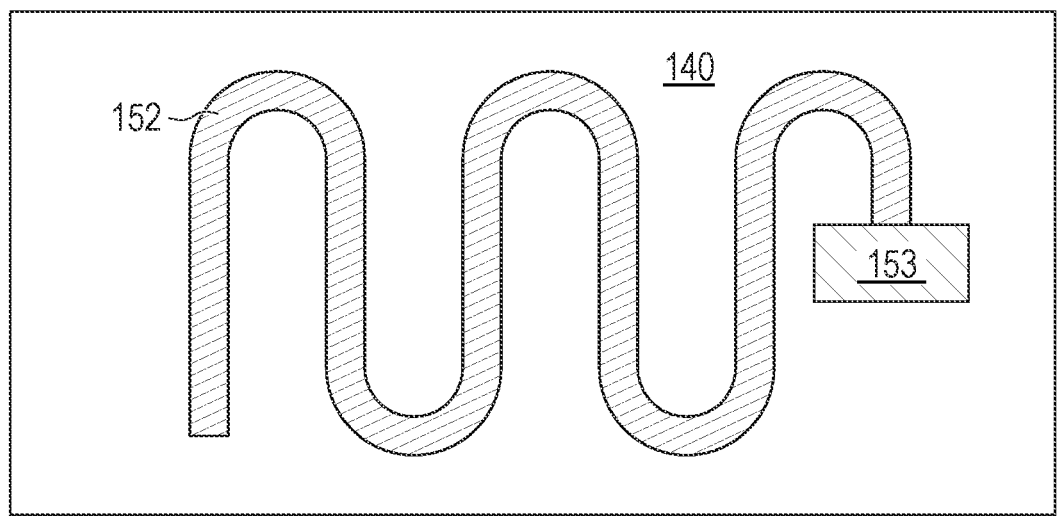
Figure 3M:
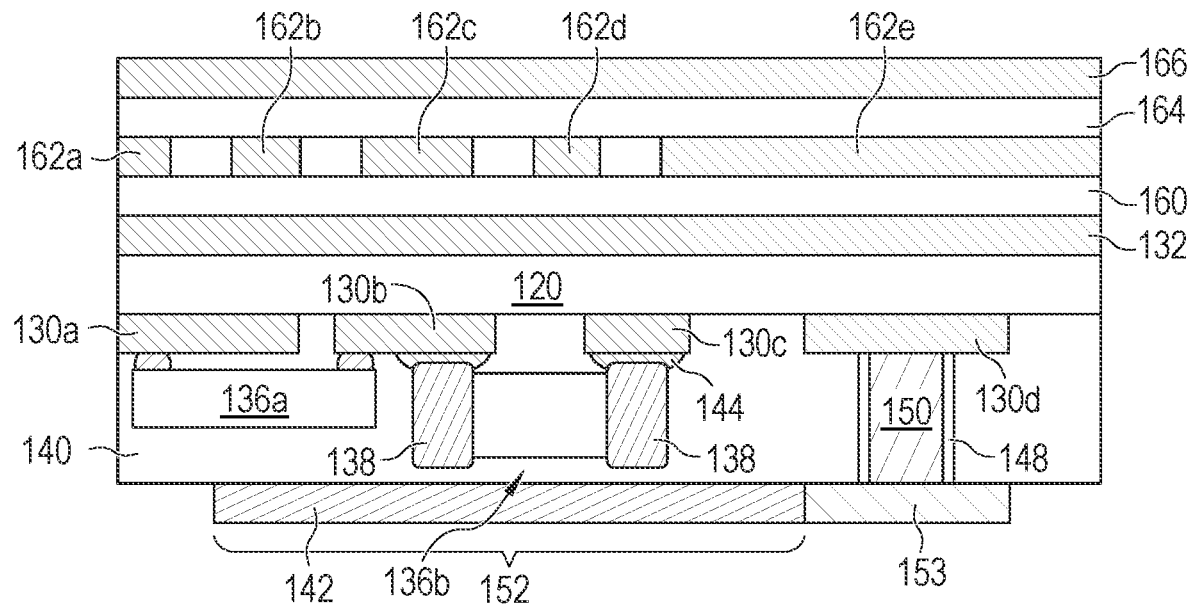
Figure 3N:
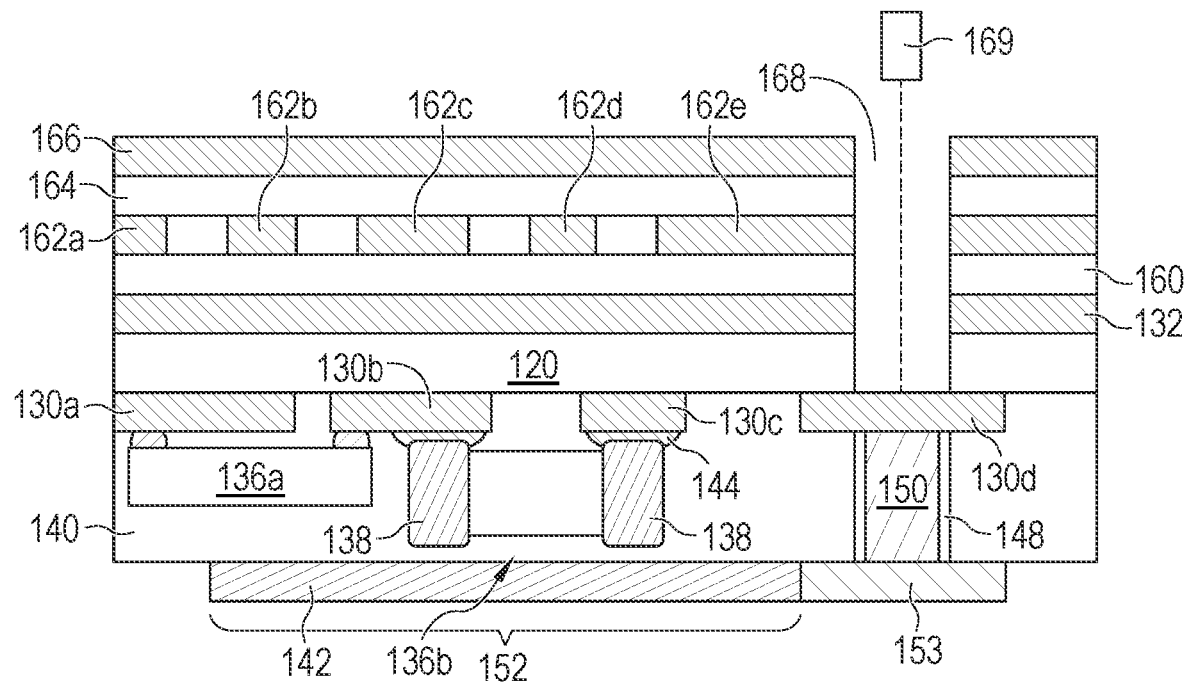
Figure 3O:
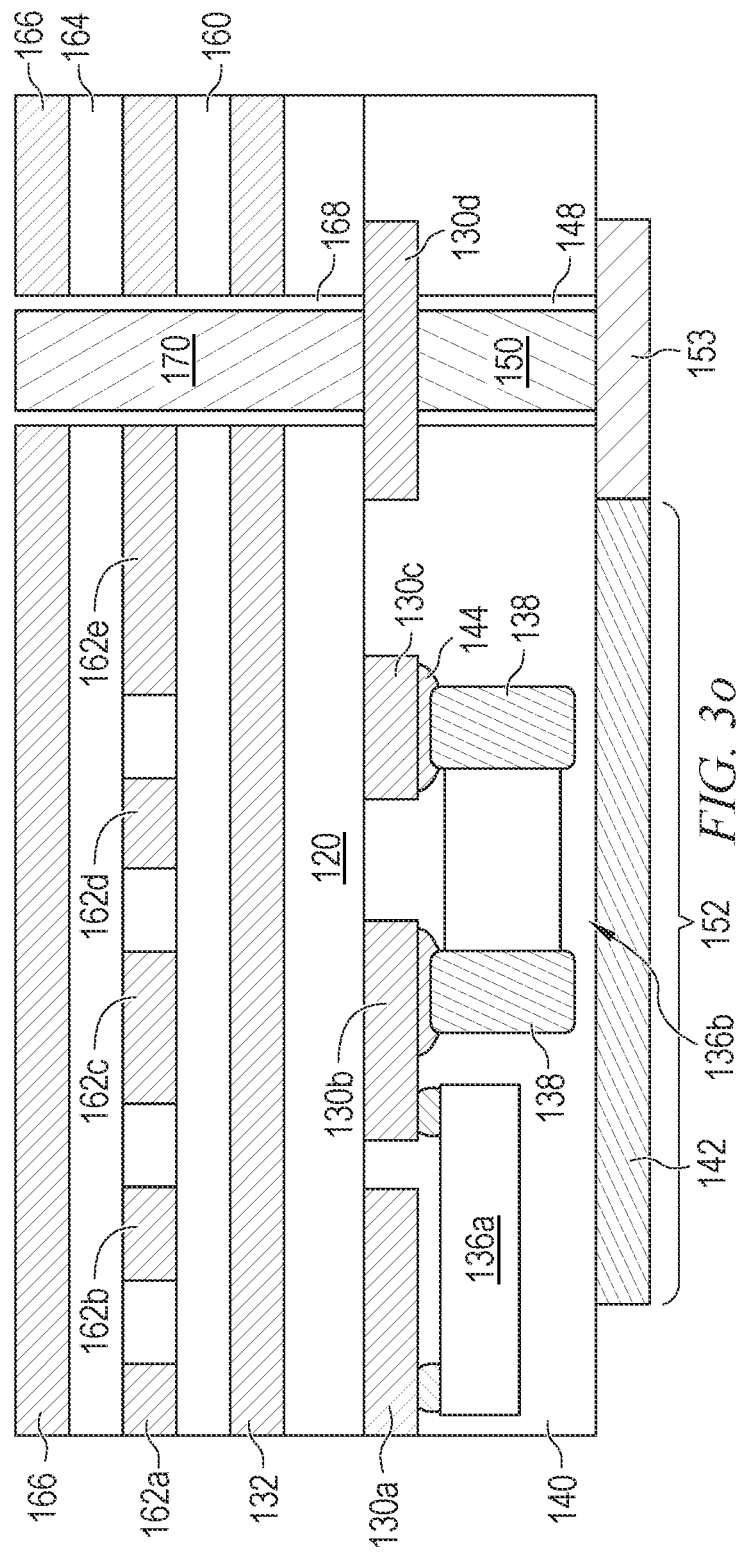
Figure 3P:
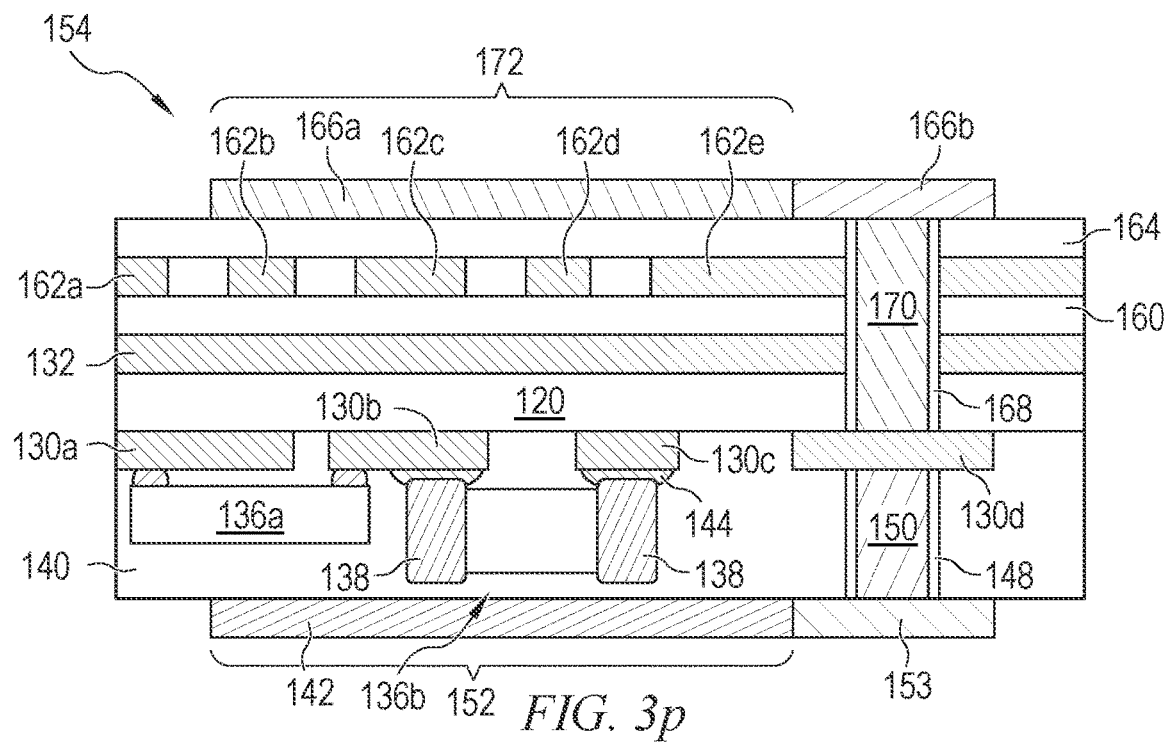
Figure 3Q:
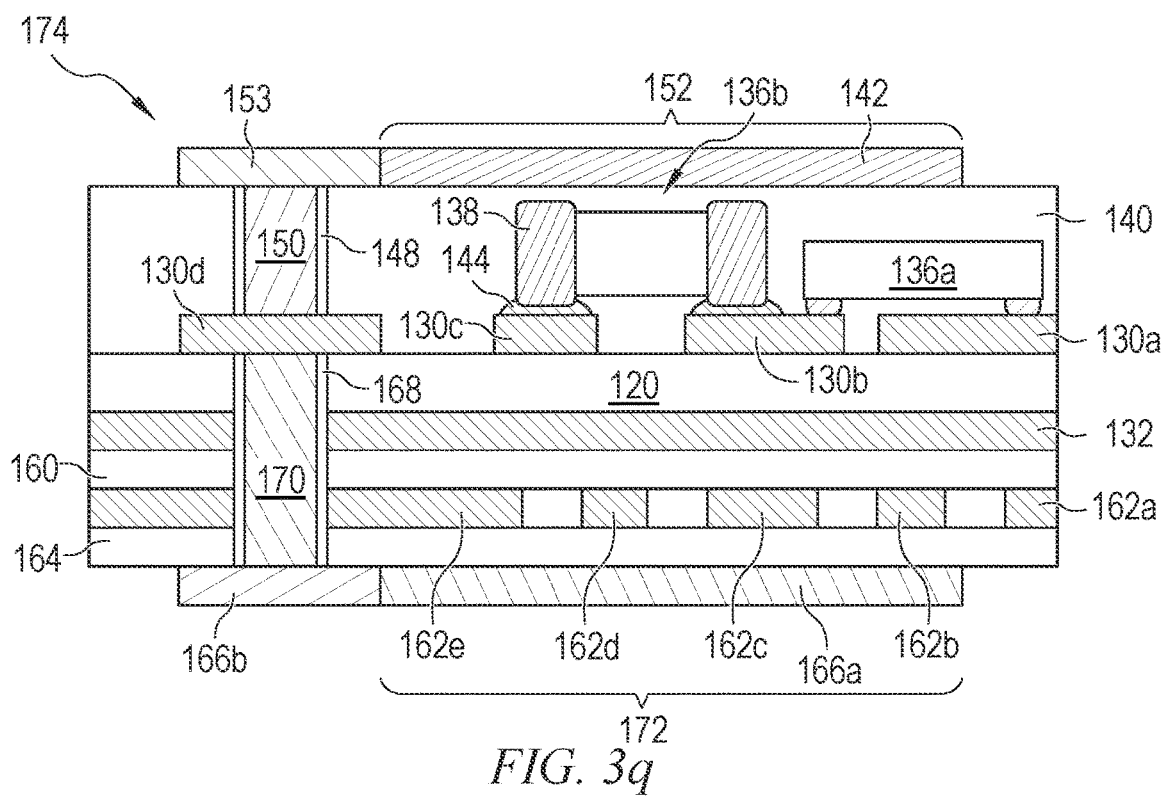
Figure 3R:
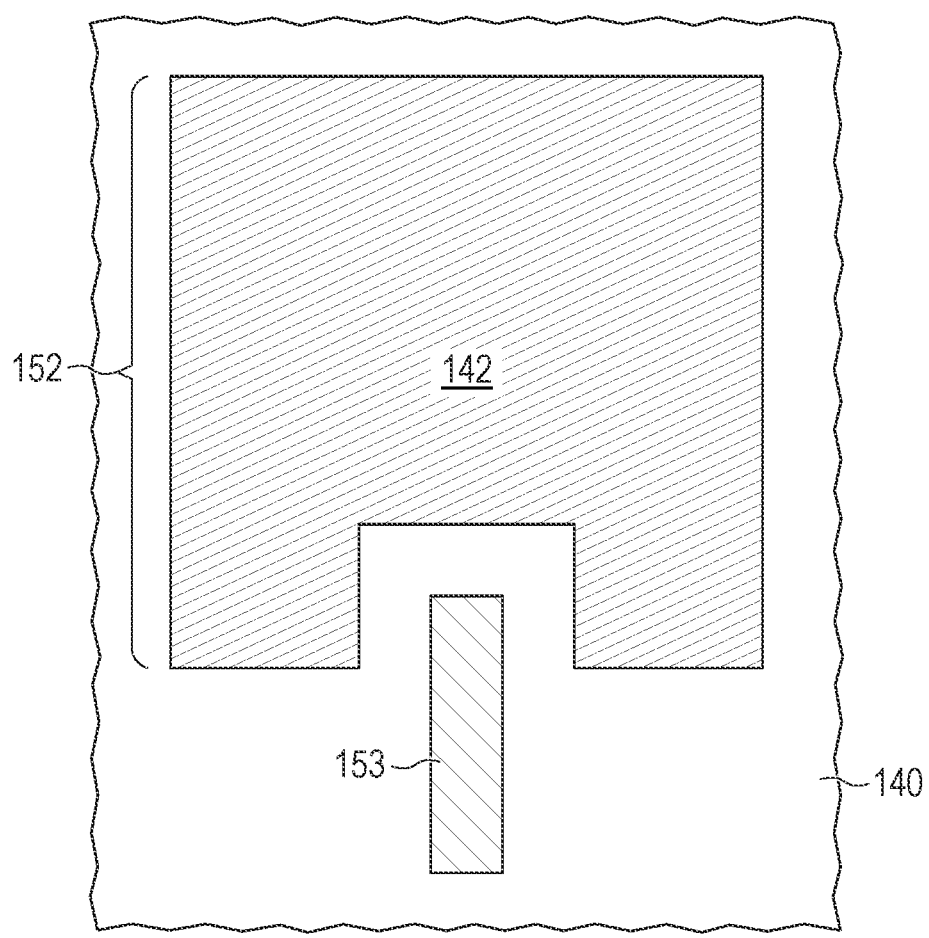

FIGS. 3a-3r illustrate a process of forming a double-sided rectifying antenna on a power module. FIG. 3a shows a core substrate 120 with major surface 122 and major surface 124, opposite major surface 122. Core substrate 120 can be a laminate material. In FIG. 3b, electrically conductive layer 130 is formed on surface 122, and electrically conductive layer 132 is formed on surface 124. Conductive layers 122 and 124 can be formed using PVD, CVD, electrolytic plating, electroless plating process, or other suitable metal deposition process. Conductive layers 130 and 132 can be one or more layers of Al, Cu, Sn, Ni, Au, Ag, or other suitable electrically conductive material. In one embodiment, conductive layers 130 and 132 are Cu foil. The combination of core substrate 120 and conductive layers 130 and 132 constitute copper core laminate (CCL) substrate.

In FIG. 3c, conductive layer 130 is patterned and etched to form a circuit layout, i.e., with conductive traces routed to provide electrical function. Alternatively, the circuit layout can be formed by laser direct ablation (LDA) using laser 134. Portions 130a, 130b, 130c, and 130d of conductive layer 130 can be electrically common or electrically isolated depending on the design and function of the power module.

In FIG. 3d, one or more electrical components 136a and 136b are disposed over surface 122 of substrate 120 and electrically and mechanically connected to conductive layer 130. For example, electrical component 136a can be similar to, or made similar to, semiconductor die 104 from FIG. 2c with bumps 114 oriented toward surface 122 of substrate 120. Electrical component 136b can be a discrete electrical device, or IPDs, such as a diode, transistor, resistor, capacitor, and inductor. Alternatively, electrical components 136a-136b can include other semiconductor die, semiconductor packages, surface mount devices, RF components, discrete electrical devices, or integrated passive devices (IPD).

Electrical components 136a-136b are positioned over substrate 120 using a pick and place operation. Electrical components 136a-136b are brought into contact with conductive layer 130. Electrical component 136a is electrically and mechanically connected to conductive layer 130a and 130b by reflowing bumps 114. Terminals 138 of electrical component 136b are electrically and mechanically connected to conductive layer 130b and 130c using solder or conductive paste 144. FIG. 3e illustrates electrical components 136a-136b electrically and mechanically connected to conductive layer 130 of substrate 120. Additional electrical components can be mounted over substrate 120 to provide the electrical functionality of the Sip power module.

In FIG. 3f, insulating material 140 is formed over and around electrical component 136 and over conductive layer 130 and substrate 120 using PVD, CVD, printing, lamination, spin coating, spray coating, sintering or thermal oxidation. Insulating material 140 can be a dielectric material, such as Ajinomoto build-up film (ABF) or polytetrafluoroethylene (PTFE) pre-impregnated (prepreg or PPG). Alternatively, insulating material 140 woven glass, matte glass, FR-4, FR-1, CEM-1, or CEM-3 with a combination of phenolic cotton paper, epoxy, resin, polyester, and other reinforcement fibers or fabrics. Insulating material 140 can also be one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. In another embodiment, insulating material 140 is an encapsulant or molding compound deposited over and around electrical components 136a-136b and substrate 120 using a paste printing, compressive molding, transfer molding, liquid encapsulant molding, vacuum lamination, spin coating, or other suitable applicator. The encapsulant can be liquid or granular polymer composite material, such as epoxy resin with filler, epoxy acrylate with filler, or polymer with proper filler. The encapsulant is non-conductive, provides structural support, and environmentally protects the semiconductor device from external elements and contaminants.

An electrically conductive layer 142 is formed on surface 146 of insulating material 140 using PVD, CVD, electrolytic plating, electroless plating process, or other suitable metal deposition process. Conductive layer 142 can be one or more layers of Al, Cu, Sn, Ni, Au, Ag, or other suitable electrically conductive material.

In FIG. 3g, an opening or via 148 is formed through insulating material 140 and extending to conductive layer 130d using an etching process or LDA with laser 147. In FIG. 3h, via 148 is filled with electrically conductive material to form conductive via 150. Conductive via 150 can be made with Al, Cu, Sn, Ni, Au, Ag, polysilicon, or other suitable electrically conductive material.

In FIG. 3i, conductive layer 142 is patterned and etched to form a circuit layout to function as antenna 152. Alternatively, antenna 152 can be formed by LDA, similar to FIG. 3c. An electrically conductive feed 153 connects antenna 152 to conductive via 150. Conductive feed 153 can be patterned from conductive layer 142 or formed after conductive via 150. FIG. 3j shows a top view of antenna 152 formed on insulating material 140 as a radiating structure 152a from a central channel 152b. FIG. 3k shows another embodiment of a top view of antenna 152 formed on insulating material 140 as a serpentine structure. Antenna 152 can also be rectangular, circular, oval, or other geometric shape.

In FIG. 3l, assembly 154 is inverted and insulating or passivation layer 160 is formed over conductive layer 132 using PVD, CVD, printing, lamination, spin coating, spray coating, sintering or thermal oxidation. Insulating layer 160 contains one or more layers of SiO2, Si3N4, SiON, Ta2O5, Al2O3, solder resist, polyimide, BCB, PBO, and other material having similar insulating and structural properties. Portions of insulating layers 160 are removed using an etching process or LDA to form openings for conductive layer 162. Alternatively, conductive layer 162 is formed over insulating layer 160 and then patterned and etched to form a circuit layout, i.e., with conductive traces routed to provide electrical function. The circuit layout can be formed by LDA. Portions 162a, 162b, 162c, and 162d of conductive layer 162 can be electrically common or electrically isolated depending on the design and function of the power module. In this case, insulating material like 160 would fill in between the portions 162a, 162b, 162c, and 162d.

In FIG. 3m, insulating or passivation layer 164 is formed over conductive layer 162 in a manner and material similar to FIG. 3l. Conductive layer 166 is formed over insulating layer 164 in a manner and material similar to FIG. 3f.

In FIG. 3n, an opening or via 168 is formed through conductive layers 166, 162, and 132 and insulating material 164, 160, and 120 and extending to conductive layer 130d using an etching process or LDA with laser 169. In FIG. 3o, via 148 is filled with electrically conductive material to form conductive via 170. Conductive via 170 can be made with Al, Cu, Sn, Ni, Au, Ag, polysilicon, or other suitable electrically conductive material.

In FIG. 3p, conductive layer 166a is patterned and etched to form a circuit layout to function as antenna 172. Alternatively, antenna 172 can be formed by LDA, similar to FIG. 3c. An electrically conductive feed 166a connects antenna 172 to conductive via 170. The top view of antenna 172 formed on insulating material 164 can be similar to FIGS. 3j and 3k. Antenna 172 can also be rectangular, circular, oval, or other geometric shape.

FIG. 3q shows Sip power module 174 with a first antenna 152 formed on a first side of the power module and a second antenna 172 formed on a second side of the power module, opposite antenna 152. Accordingly, SiP power module 174 has a double-sided rectifying antenna 152, 172. Rectifying antenna 152 and 172 can operate at different frequencies. In one embodiment, antenna 152 operates a 2.45 GHZ, and antenna 172 operates at 5.8 GHZ. SiP power module 174 is a vertical structure with interconnect structures and electrical components on both sides of core substrate 120. Double-sided rectifying antenna 152, 172 make electrical connection to electrical components 136a-136b through conductive layers 130, 132, and 162, and conductive vias 150 and 170. Conductive via 150 provides more isolation between transmission lines, helpful for ground and pad isolation and minimizing impedance discontinuity.

Antenna 152 and 172 can also be indirectly coupled, as shown in the top view of FIG. 3r. For example, antenna 152 and 172 can be magnetically coupled to conductive layers 153 and 166b and conductive vias 150 and 170.

Figure 4:
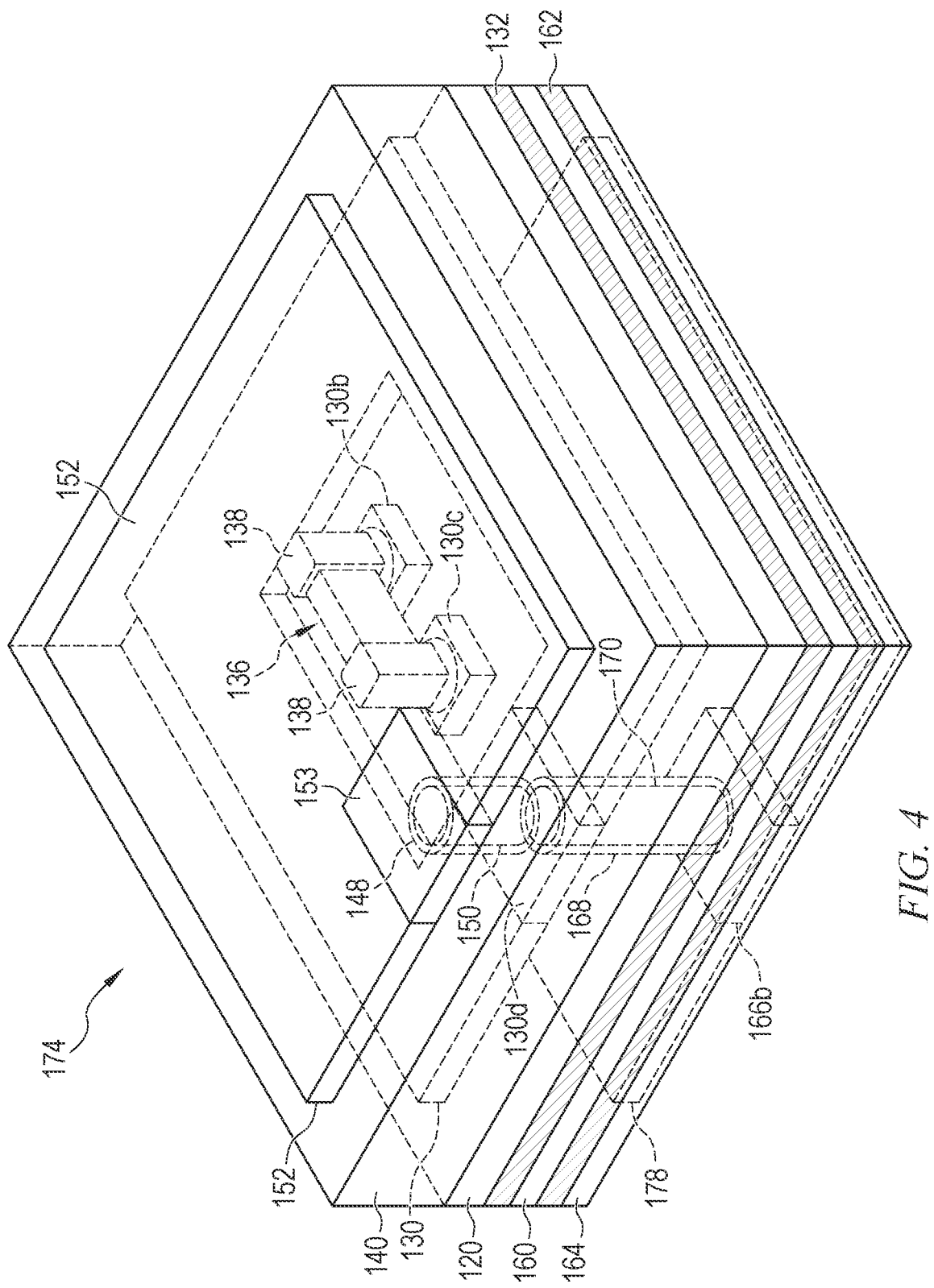
FIG. 4 illustrates a perspective view of the double-sided rectifying antenna on the power module.

FIG. 4 is a perspective view of SiP power module 174. The double-sided rectifying antenna 152, 172 absorbs greater RF energy, as compared to the prior art discussed in the background. Double-sided rectifying antenna 152, 172 make electrical connection to electrical components 136a-136b through conductive layers 130, 132, and 162, and conductive vias 150 and 170. More energy can be harvested with the same expected efficiency by absorbing energy from two different directions simultaneously. The vertical structure allows the antennas, electrical interconnect, and load circuits to exist at different levels, while increasing isolation between antenna 152 and antenna 172, all in a compact size due to the semiconductor manufacturing process. SiP power module 174 is applicable to low voltage charging devices, contactless device, 5G system, and renewable energy utilization.

Figure 5A:
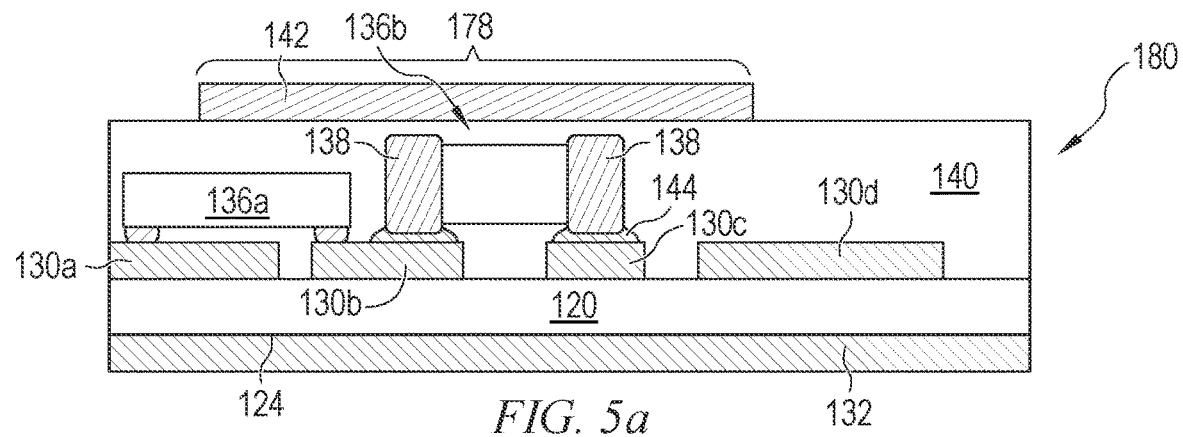
FIGS. 5*a*-5*g* illustrate another embodiment of the double-sided rectifying antenna on the power module.

In another embodiment, continuing from FIG. 3f, conductive layer 142 is patterned and etched to form a circuit layout to function as antenna 178, as shown in FIG. 5a. Alternatively, antenna 178 can be formed by LDA, similar to FIG. 3c. The top view of antenna 178 formed on insulating material 140 can be similar to FIGS. 3j and 3k. Antenna 178 can also be rectangular, circular, oval, or other geometric shape.

Figure 5B:
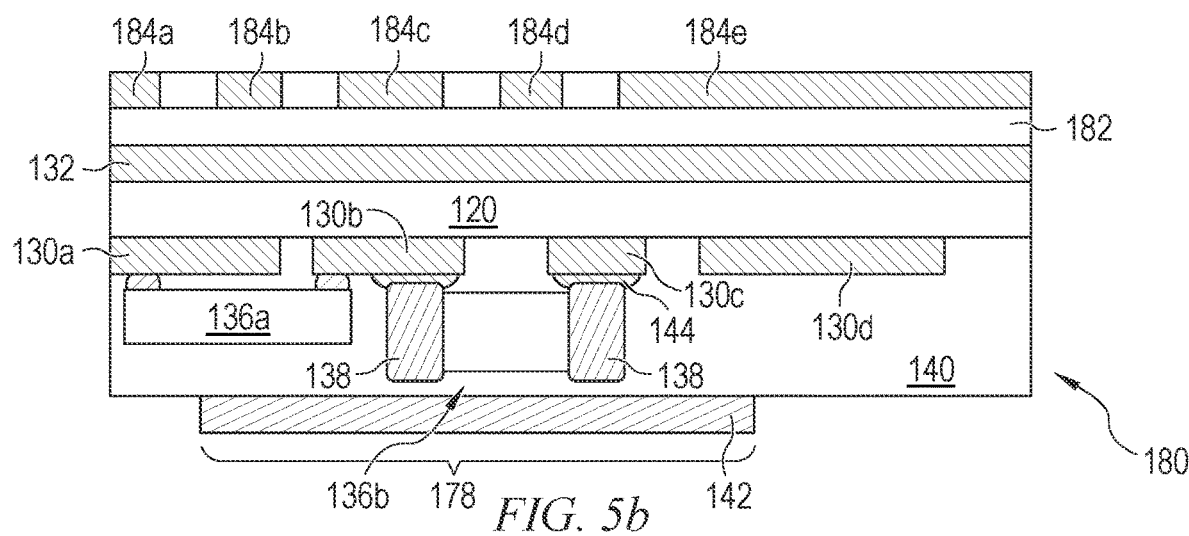

In FIG. 5b, assembly 180 is inverted and insulating or passivation layer 182 is formed over conductive layer 132 using PVD, CVD, printing, lamination, spin coating, spray coating, sintering or thermal oxidation. Insulating layer 182 contains one or more layers of SiO2, Si3N4, SiON, Ta2O5, Al2O3, solder resist, polyimide, BCB, PBO, and other material having similar insulating and structural properties. Portions of insulating layers 182 are removed using an etching process or LDA to form openings for conductive layer 184. Alternatively, conductive layer 184 is formed over insulating layer 182 in a manner and material similar to FIG. 3f. Conductive layer 184 is patterned and etched to form a circuit layout, i.e., with conductive traces routed to provide electrical functions. The circuit layout can be formed by LDA. Portions 184a, 184b, 184c, 184d, and 184e of conductive layer 184 can be electrically common or electrically isolated depending on the design and function of the power module. In this case, insulating material like 182 would fill in between the portions 184a, 184b, 184c, 184d, and 184e.

Figure 5C:
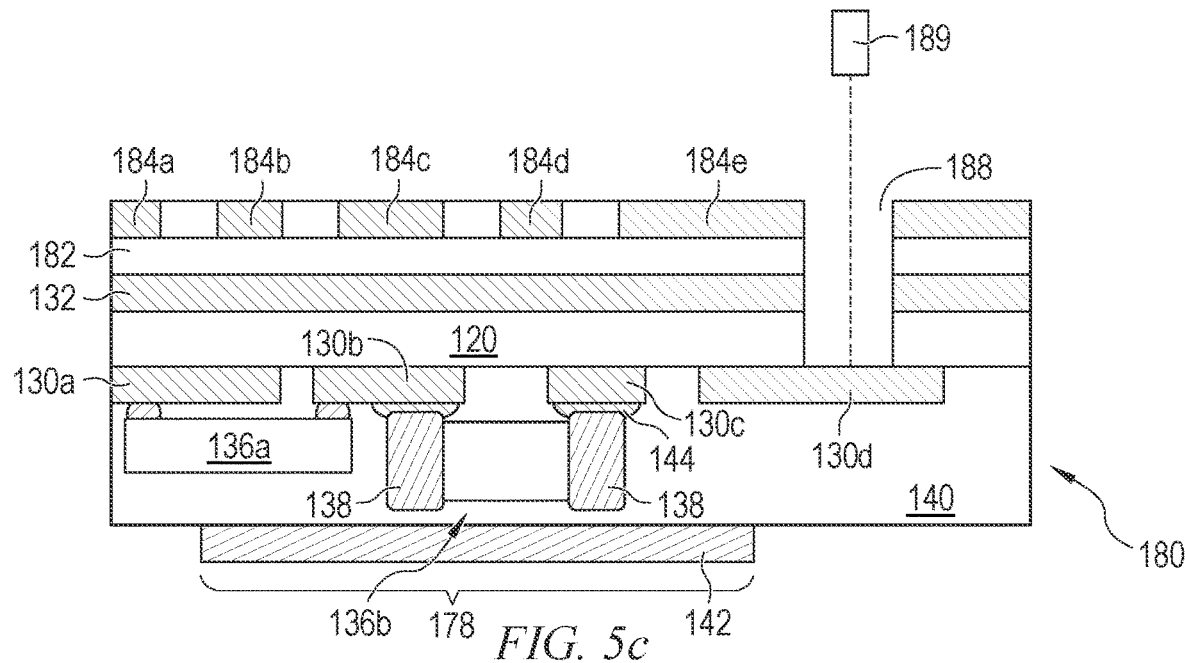
Figure 5D:
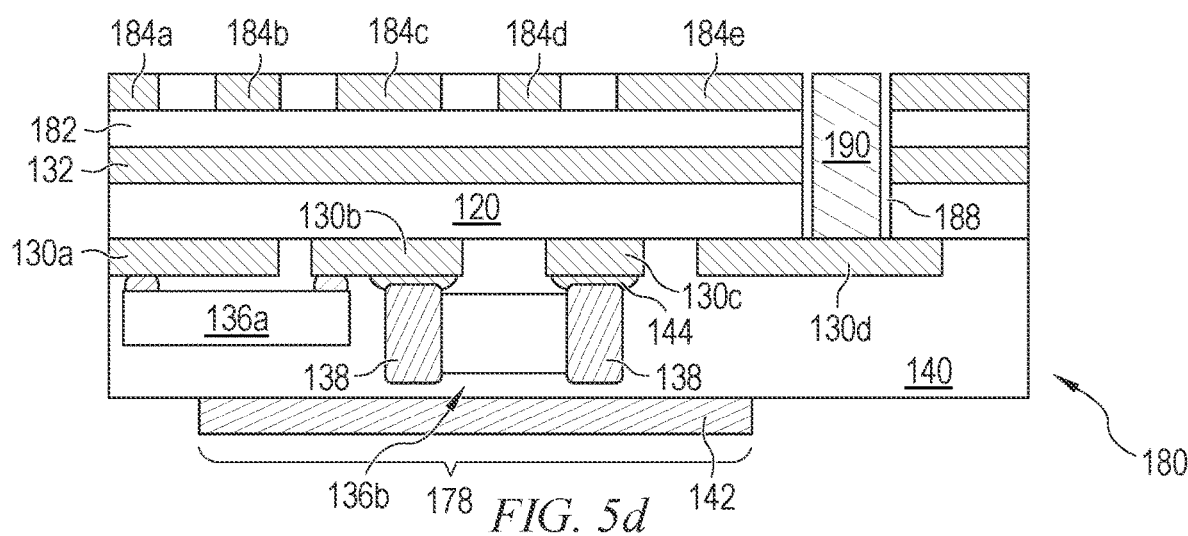
Figure 5E:
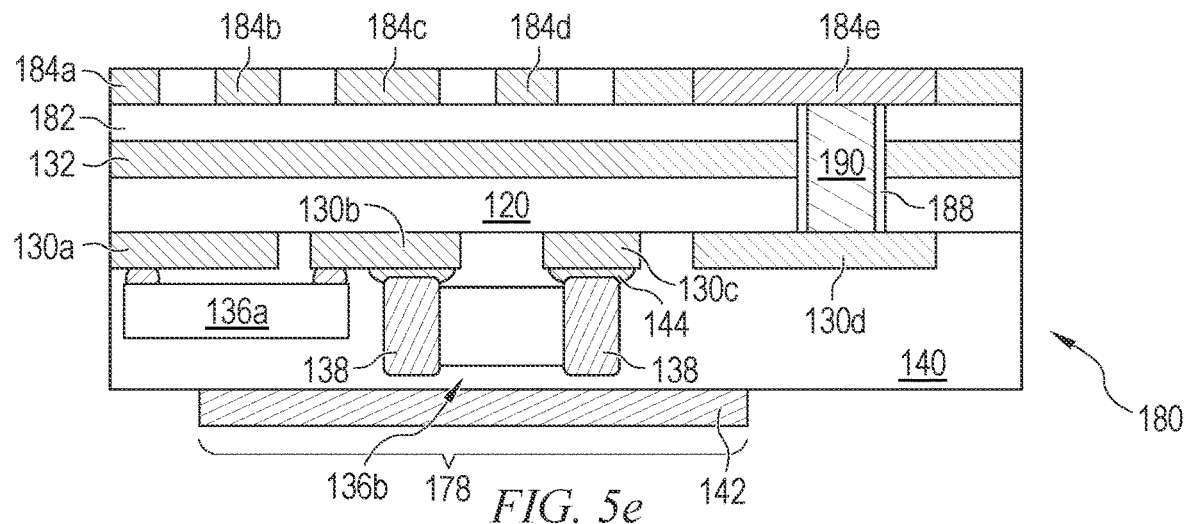

In FIG. 5c, an opening or via 188 is formed through conductive layers 132 and 184 and insulating layer 182 and core substrate 120 to conductive layer 130d using an etching process or LDA with laser 189. In FIG. 5d, via 188 is filled with electrically conductive material to form conductive via 190. Conductive via 190 can be made with Al, Cu, Sn, Ni, Au, Ag, polysilicon, or other suitable electrically conductive material. FIG. 5e shows conductive via 190 electrically connected to conductive layer 184e.

Figure 5F:
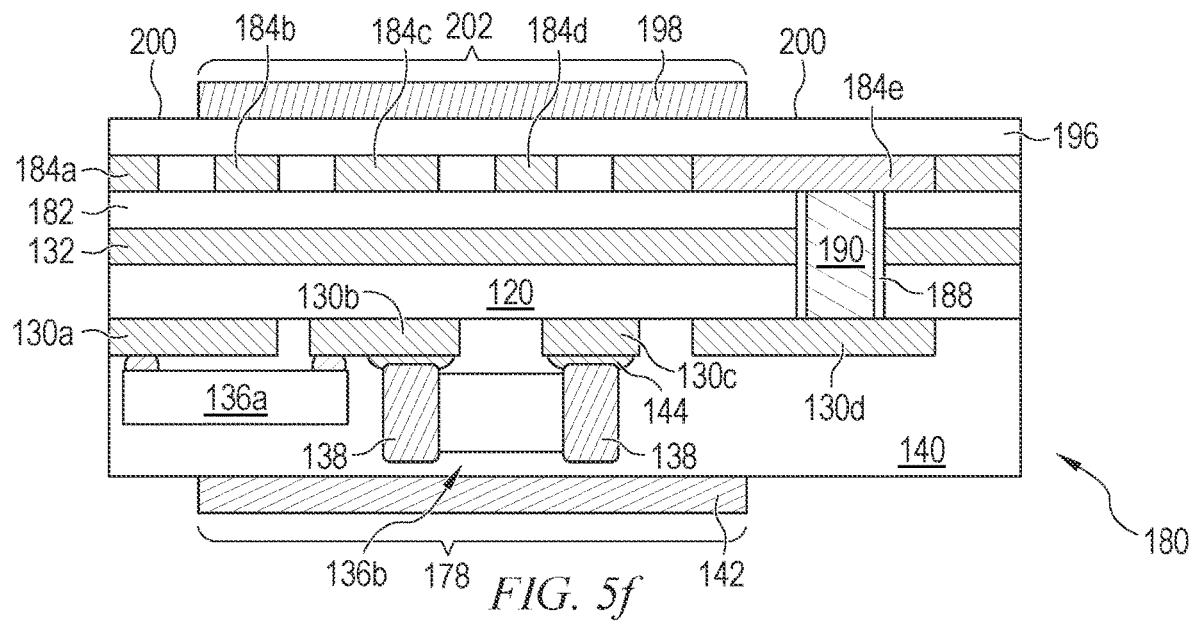

In FIG. 5f, insulating or passivation layer 196 is formed over conductive layer 184 and insulating layer 182 using PVD, CVD, printing, lamination, spin coating, spray coating, sintering or thermal oxidation. Insulating layer 196 contains one or more layers of SiO2, Si3N4, SiON, Ta2O5, Al2O3, solder resist, polyimide, BCB, PBO, and other material having similar insulating and structural properties.

An electrically conductive layer 198 is formed over surface 200 of insulating layer 196 in a manner and material similar to FIG. 3*f*. Conductive layer 198 is patterned and etched to form a circuit layout to function as antenna 202. Alternatively, antenna 202 can be formed by LDA, similar to FIG. 3*c*. An electrically conductive feed 184*e* connects antenna 202 to conductive via 190. The top view of antenna 202 formed on insulating material 196 can be similar to FIGS. 3*j* and 3*k*. Antenna 202 can also be rectangular, circular, oval, or other geometric shape.

Figure 5G:
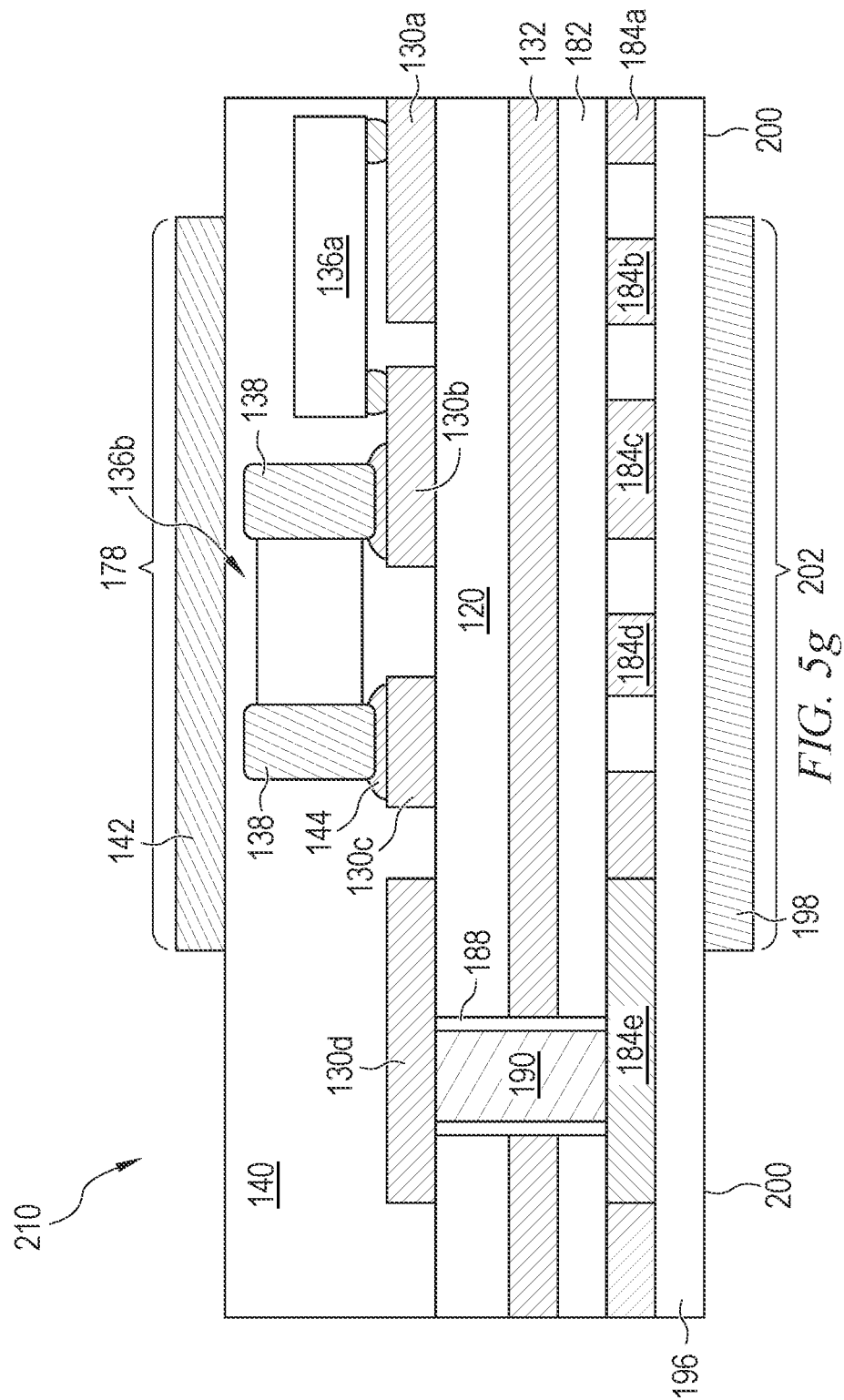

FIG. 5*g* shows power module 210 with a first antenna 178 formed on a first side of the power module and a second antenna 202 formed on a second side of the power module, opposite antenna 178. Accordingly, SiP power module 210 has a double-sided rectifying antenna 178, 202. Rectifying antenna 178 and 202 can operate at different frequencies. In one embodiment, antenna 178 operates a 2.45 GHZ, and antenna 202 operates at 5.8 GHz. SiP power module 210 is a vertical structure with interconnect structures and electrical components on both sides of core substrate 120. Antenna 178 and 202 are indirectly coupled to conductive via 190. For example, antenna 178 and 202 can be magnetically coupled to conductive layers 130 and 184 and conductive via 190. Conductive via 190 provides more isolation between transmission lines, helpful for ground and pad isolation and minimizing impedance discontinuity. More energy can be harvested with the same expected efficiency by absorbing energy from two different directions simultaneously. The vertical structure allows the antennas, electrical interconnect, and load circuits to exist at different levels, while increasing isolation between antenna 178 and antenna 202, all in a compact size due to the semiconductor manufacturing process. SiP power module 210 is applicable to low voltage charging devices, contactless device, 5G system, and renewable energy utilization.

Figure 6:
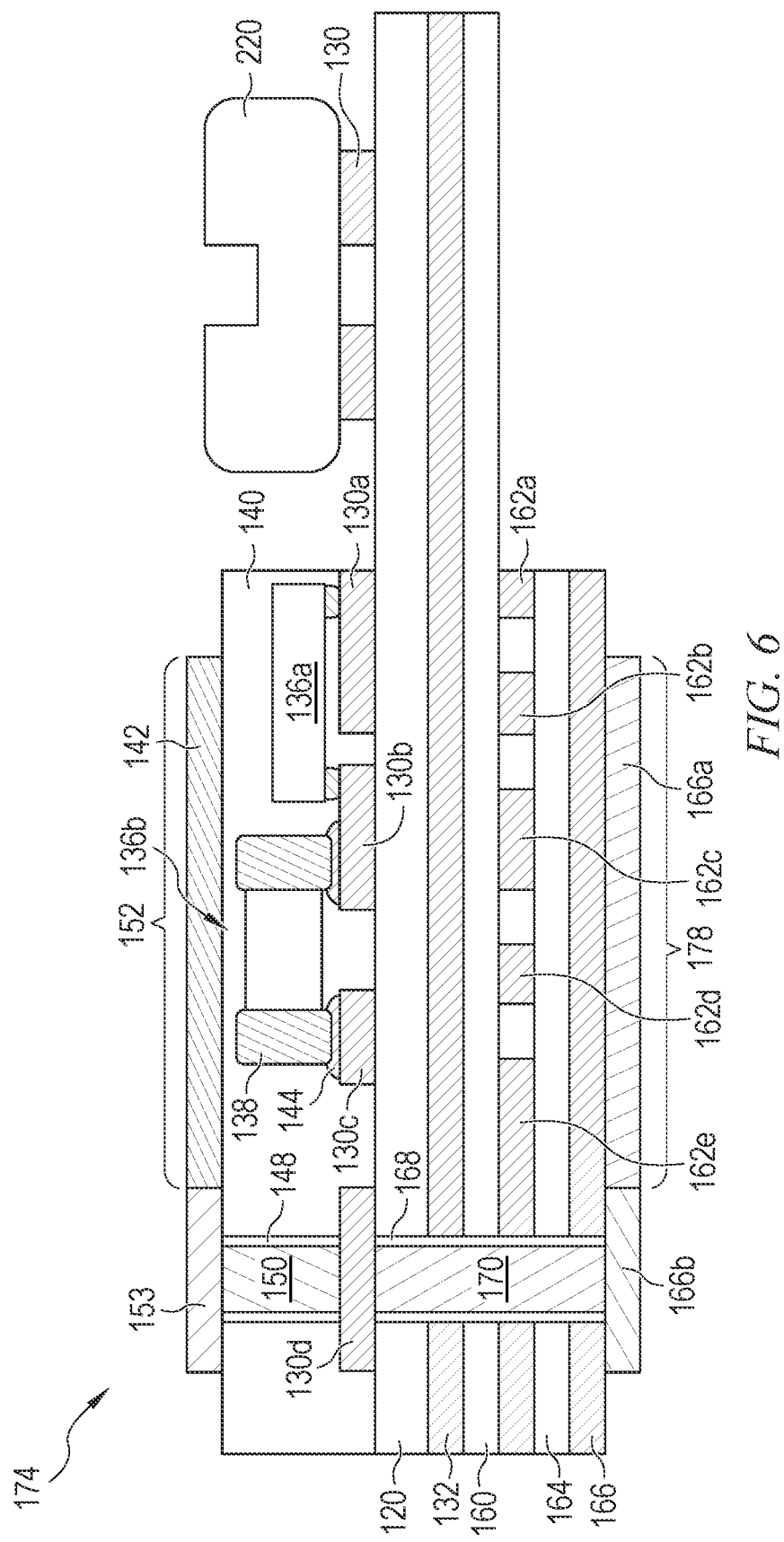
FIG. 6 illustrates a power connector mounted to the power module.

FIG. 6 illustrates power connector 220 mounted to conductive layer 130 of power module 174 or power module 210.

Figure 7:
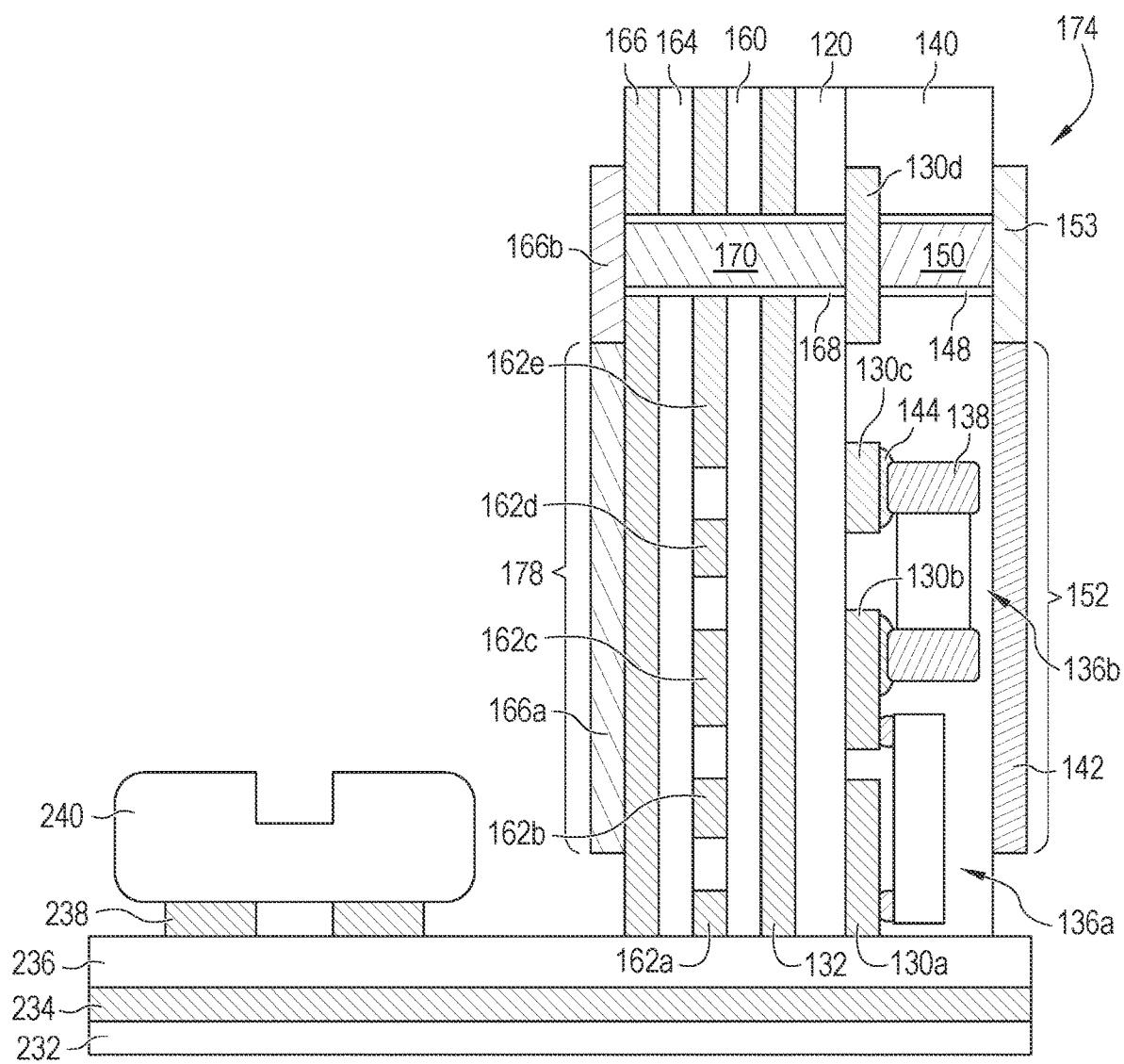
FIG. 7 illustrates another power connector mounted to the power module.

FIG. 7 illustrates substrate 230 with insulating layer 233, conductive layer 234, insulating layer 236, and conductive layer 238, similar to FIGS. 3*a*-3*r*. Power module 174 or power module 210 is mounted to substrate 230, in this case normal to the substrate. Power connector 240 mounted to conductive layer 238 of substrate 230.

Figure 8:
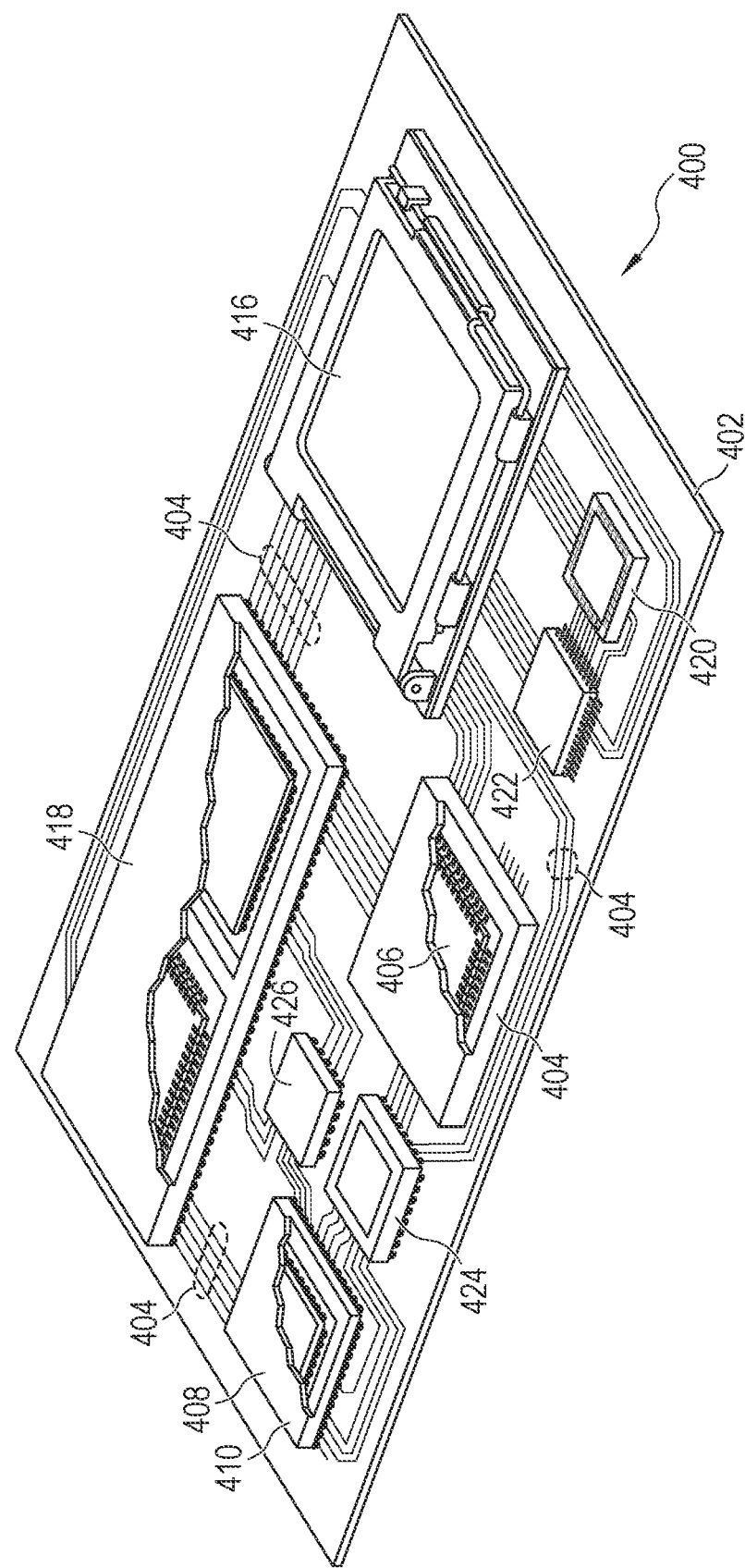
FIG. 8 illustrates a printed circuit board (PCB) with different types of packages disposed on a surface of the PCB.

FIG. 8 illustrates electrical device 400 having a chip carrier substrate or PCB 402 with a plurality of semiconductor packages disposed on a surface of PCB 402, including power module 174 and power module 210. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 8, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a substrate;
    a first electrical interconnect structure formed over a first surface of the substrate;
    a first conductive via extending through the substrate and further extending through the first electrical interconnect structure;
    a second electrical interconnect structure formed over a second surface of the substrate opposite the first surface of the substrate;
    a device layer formed over the second electrical interconnect structure;

a second conductive via extending through the device layer;

a first antenna formed over the first electrical interconnect structure; and a second antenna formed over the device layer.

2. The semiconductor device of claim 1, wherein the device layer includes an electrical component disposed over the second surface of the substrate.

3. The semiconductor device of claim 2, wherein the device layer further includes an insulating material formed over the electrical component and second surface of the substrate.

4. The semiconductor device of claim 1, further including:

an insulating layer formed over the first surface of the substrate or over the second surface of the substrate;

a conductive layer formed over the insulating layer; and a conductive via formed through the insulating layer and conductive layer.

5. The semiconductor device of claim 1, wherein the first electrical interconnect structure and second electrical interconnect structure and first antenna and second antenna are each disposed at a different vertical displacement from the substrate.

6. The semiconductor device of claim 1, wherein the first electrical interconnect structure and second electrical interconnect structure provide isolation between the first antenna and second antenna.

7. A semiconductor device, comprising:

a substrate;

a first antenna disposed over a first surface of the substrate; and a second antenna disposed over a second surface of the substrate opposite the first surface of the substrate and adapted to operate simultaneously with the first antenna and at a different frequency from the first antenna;

further including:

a first electrical interconnect structure formed over the first surface of the substrate;

a first conductive via extending through the substrate and first electrical interconnect structure;

a second electrical interconnect structure formed over the second surface of the substrate;

a device layer formed over the second electrical interconnect structure; and a second conductive via extending through the device layer.

8. The semiconductor device of claim 7, further including an electrical component disposed over the first surface of the substrate or over the second surface of the substrate.

9. The semiconductor device of claim 7, wherein the device layer includes an insulating material formed over the second surface of the substrate.

10. The semiconductor device of claim 7, further including:

an insulating layer formed over the first surface of the substrate or over the second surface of the substrate;

a conductive layer formed over the insulating layer; and a conductive via formed through the insulating layer and conductive layer.

11. The semiconductor device of claim 7, wherein the first electrical interconnect structure and second electrical interconnect structure and first antenna and second antenna are each disposed at a different vertical displacement from the substrate.

12. The semiconductor device of claim 7, wherein the first electrical interconnect structure and second electrical interconnect structure provide isolation between the first antenna and second antenna.

13. A method of making a semiconductor device, comprising:

providing a substrate;

forming a first electrical interconnect structure over a first surface of the substrate;

forming a first conductive via extending through the substrate and first electrical interconnect structure;

forming a second electrical interconnect structure over a second surface of the substrate opposite the first surface of the substrate;

forming a first antenna over the first electrical interconnect structure; and forming a second antenna over the second electrical interconnect structure.

14. The method of claim 13, further including disposing an electrical component over the first surface of the substrate or over the second surface of the substrate.

15. The method of claim 13, further including:

forming an insulating material over the first surface of the substrate or over the second surface of the substrate; and forming a conductive via through the insulating material.

16. The method of claim 13, further including:

forming an insulating layer over the first surface of the substrate or over the second surface of the substrate;

forming a conductive layer over the insulating layer; and forming a conductive via through the insulating layer and conductive layer.

17. The method of claim 13, wherein the first electrical interconnect structure and second electrical interconnect structure and first antenna and second antenna are each disposed at a different vertical displacement from the substrate.

18. The method of claim 13, wherein the first electrical interconnect structure and second electrical interconnect structure provide isolation between the first antenna and second antenna.

19. The method of claim 13, further including:

forming a device layer over the second electrical interconnect structure; and forming a second conductive via extending through the device layer, wherein the second antenna is formed over the device layer.

20. A method of making a semiconductor device, comprising:

providing a substrate;

disposing a first antenna over a first surface of the substrate;

disposing a second antenna over a second surface of the substrate opposite the first surface of the substrate and adapted to operate simultaneously with the first antenna and at a different frequency from the first antenna;

forming a first electrical interconnect structure over the first surface of the substrate;

a second electrical interconnect structure formed over the second surface of the substrate;

forming a device layer over the second electrical interconnect structure; and forming a second conductive via extending through the device layer, wherein the second antenna is formed over the device layer.

21. The method of claim 20, further including disposing an electrical component over the first surface of the substrate or over the second surface of the substrate.

22. The method of claim 20, further including:
   forming an insulating material over the first surface of the substrate or over the second surface of the substrate; and
   forming a conductive via through the insulating material.

23. The method of claim 20, further including:
   forming an insulating layer over the first surface of the substrate or over the second surface of the substrate;
   forming a conductive layer over the insulating layer; and
   forming a conductive via through the insulating layer and conductive layer.

24. The method of claim 20, wherein the first electrical interconnect structure and second electrical interconnect structure and first antenna and second antenna are each disposed at a different vertical displacement from the substrate.

* * * * *